United States Patent
Mackey

(10) Patent No.: US 7,150,945 B2
(45) Date of Patent: Dec. 19, 2006

(54) POLARIZED RETICLE, PHOTOLITHOGRAPHY SYSTEM, AND METHOD OF FORMING A PATTERN USING A POLARIZED RETICLE IN CONJUNCTION WITH POLARIZED LIGHT

(75) Inventor: Jeff Mackey, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 351 days.

(21) Appl. No.: 10/715,955

(22) Filed: Nov. 18, 2003

(65) Prior Publication Data

US 2005/0105180 A1   May 19, 2005

(51) Int. Cl.
*G01F 9/00* (2006.01)
(52) U.S. Cl. ............................................. 430/5
(58) Field of Classification Search .............. 430/5, 430/30, 394; 356/400; 359/485, 500
See application file for complete search history.

(56) References Cited

U.S. PATENT DOCUMENTS

| | | | |
|---|---|---|---|
| 5,245,470 A | 9/1993 | Keum | |
| 5,459,000 A * | 10/1995 | Unno | ............................. 430/5 |
| 5,673,103 A | 9/1997 | Inoue et al. | |
| 5,677,755 A | 10/1997 | Oshida et al. | |
| 6,057,970 A * | 5/2000 | Kim et al. | .................. 359/721 |
| 6,163,367 A | 12/2000 | Obszarny | |
| 2002/0197541 A1 | 12/2002 | Grobman et al. | |

FOREIGN PATENT DOCUMENTS

| | | |
|---|---|---|
| JP | 5188576 A2 | 7/1993 |
| JP | 05241324 | 9/1993 |
| JP | 7176476 A2 | 7/1995 |
| KR | 00246363 B1 | 6/1999 |
| TW | 0424263 B | 3/2001 |
| TW | 0425495 B | 3/2001 |
| WO | WO 02/44817 A2 | 6/2002 |

OTHER PUBLICATIONS

International Search Report dated Aug. 8, 2005 (4 pages).
Wang et al., "Polarized Phase Shift Mask: Concept, Design, and Potential Advantages to Photolithography Process and Physical Design," Proceedings of SPIE, vol. 4562, 2002, pp. 406-417.
Lam et al, "Polarization masks: concept and initial assessment," Proceedings of SPIE, vol. 4691, 2002, pp. 437-445.
Börnig et al, "The Impact of Polarized Illumination on Imaging Characteristics in Optical Microlithography," Microelectronic Engineering, Elsevier Science B.V., vol. 27, 1995, pp. 217-220.

* cited by examiner

*Primary Examiner*—S. Rosasco
(74) *Attorney, Agent, or Firm*—TraskBritt

(57) ABSTRACT

Polarized reticles, photolithography systems utilizing a polarized reticle, and methods of using such a system are disclosed. A polarized reticle is formed having a reticle containing at least one first patterned region at least partially surrounded by at least one second patterned region. The first patterned region of the polarized reticle includes a polarized material and the second patterned region of the polarized reticle also includes a polarized material. Polarization directions of the polarized materials of the two regions are generally orthogonal to each other. When the polarized reticle is irradiated using linear polarized light having a selected polarization direction, the polarized materials on the two regions of the polarized reticle may be selectively used as a filter to enable exposing the different regions of the polarized reticle separately under optimal illumination conditions.

52 Claims, 6 Drawing Sheets

POLARIZED RETICLE, PHOTOLITHOGRAPHY SYSTEM, AND METHOD OF FORMING A PATTERN USING A POLARIZED RETICLE IN CONJUNCTION WITH POLARIZED LIGHT

BACKGROUND OF THE INVENTION

1. Field of the Invention

The present invention relates to the design of reticles used in photolithographic processing of substrates such as semiconductor wafers. More specifically, the present invention relates to reticles having a layer of a polarized material and methods of exposing the reticle using polarized light to produce a high resolution image on a photoresist.

2. State of the Art

Semiconductor devices including integrated circuitry, such as memory dice, are mass produced by fabricating hundreds or even billions of circuit patterns on a single semiconductor wafer or other bulk semiconductor substrate using photolithography in combination with various other processes. In order to increase the number of memory cells on semiconductor memory devices for a given surface area, it is important to accurately control the optical resolution of the images produced during photolithography. These images are used to define structural features on a semiconductor substrate to fabricate the integrated circuitry of such semiconductor memory devices.

Photolithography is a process in which a pattern is delineated in a layer of material, such as a photoresist, sensitive to photons, electrons, or ions. In photolithography, an object containing a pattern (e.g., reticle or mask) is exposed to incident light. The image from the reticle or mask is projected onto a photoresist that covers a semiconductor wafer or other substrate. The photolithographic process typically involves exposing and developing the photoresist multiple times with deposition, etch, and/or implant steps in between. At a given step, the photoresist is selectively exposed to photons, electrons, or ions, then developed to remove one of either the exposed or unexposed portions of photoresist, depending on whether a positive or negative photoresist is employed. A complex device typically requires multiple exposure and development steps.

There are three predominant conventional photolithography methods of optically transferring a pattern on a reticle or mask to a photoresist that is coated on a substrate. These methods are contact printing, proximity printing, and projection printing. Currently, projection printing is the most frequently used type of photolithography system. Referring to FIG. 1, a conventional photolithography system used in projection printing is shown. Photolithography system 100 includes illumination controller 102 operably coupled to illumination source 104 for producing light. Illumination source 104 typically includes a mirror, a lamp, a laser, a light filter, and/or a condenser lens system. In the exposing system shown in FIG. 1, illumination source 104 irradiates reticle 106 having the desired pattern to be projected onto photoresist 110. Projection lens 108, which may include a complex set of lenses and/or mirrors, focuses the image from reticle 106 onto photoresist 110. Photoresist 110 is developed and substrate 112 is subsequently processed as by etching to form the desired structures and photoresist 110 is then removed.

A major problem in the manufacture of memory dice and other semiconductor devices using photolithography is that the periphery region and the array region of the reticle have their largest process windows under different illumination conditions. This problem is particularly exacerbated when the feature sizes to be formed on the photoresist are small, such as around on the order of one-half of the wavelength of the light source used, or less. A typical reticle pattern of reticle 200 comprises an array region 204 and a peripheral region 202 as shown in FIG. 2A. FIG. 2B illustrates a view of a single array region 204 surrounded by the peripheral region 202. Again referring to FIGS. 2A and 2B, the array region 204 and the peripheral region 202 of reticle 200 have different patterns. For instance, the array region 204 may contain a periodic pattern with particular dimensions and the peripheral region 202 may contain a different pattern having a smaller or larger dimension, possibly a different periodic pattern, or even a nonperiodic pattern.

In conventional photolithography, the peripheral pattern and the array pattern of the reticle are exposed to the illumination source at the same time. However, the optimal illumination conditions for the array region and the peripheral region are not identical. The term "illumination condition" as used herein should be understood to include the distribution of angles of light used to irradiate the reticle and the total intensities of the light in those angles. A relatively tightly spaced pattern characteristic of the array region typically requires illumination by a circular annulus of light at a fairly steep incident angle. A relatively sparse pattern characteristic of the peripheral region typically has its optimal illumination conditions when using a single plane wave of incident light. Thus, each region of the reticle has particular illumination conditions such as depth of focus, dose and angle of incident light, among others, which have different optimal values for the array and the peripheral region. Therefore, if the illumination conditions are optimized for the array region, the illumination conditions for the peripheral region are suboptimal and vice versa. U.S. Pat. No. 5,245,470 to Keum attempts to overcome some of the problems with producing patterns using photolithography.

A possible solution to this problem is to use more than one reticle, as is commonly known in the art, and sometimes used in the fabrication of semiconductor devices. However, the use of dual reticles suffers from two main deficiencies. First, it adds the additional cost of manufacturing or buying a second reticle. Second, the use of more than one reticle decreases the process throughput by requiring the changing out of the first reticle for the second reticle and often times necessitating recalibration of the photolithography system. Third, the use of more than one reticle also causes problems with overlay errors between the two reticles.

Accordingly, in order to improve the quality of patterns transferred to photoresists using photolithography, a need exists for a single reticle photolithography system suitable for exposing regions of the reticle having distinct patterns under different illumination conditions optimal for each respective region.

BRIEF SUMMARY OF THE INVENTION

The present invention, in a number of embodiments, includes polarized reticles, methods of manufacturing the polarized reticles, photolithography systems utilizing such polarized reticles, and methods of using the polarized reticles to produce a patterned image on a photoresist. By using the polarized reticles of the present invention, a single reticle having a plurality of patterned regions may be exposed to light under optimum illumination conditions for each particular region. The present invention may be used in photolithographic processing for fabrication of semiconductor devices, liquid crystal display elements, thin-film magnetic heads, reticles, and for many other applications that require accurate photolithographic imaging.

In one aspect of the present invention, a polarized reticle having at least one layer of a polarized material is disclosed. The polarized reticle includes at least one first patterned region at least partially surrounded by at least one second patterned region, each region having different patterns defined thereon. A polarized material may be disposed over at least a portion of the first patterned region of the reticle and a polarized material may be disposed over at least a portion of the second patterned region. The polarization direction of the polarized material on the first patterned region is generally orthogonal to the polarization direction of the polarized material on the second patterned region. Methods of fabricating the polarized reticle of the present invention are also disclosed.

In another aspect of the present invention, a photolithography system is disclosed. The photolithography system includes an illumination controller operably coupled to an illumination source. An illumination source such as, for example, a laser may be used to irradiate linear polarized light. A movable half-wave polarizer may be disposed between a polarized reticle of the present invention and the illumination source. The movable half-wave polarizer is positioned and configured to alter the polarization direction of the light from the illumination source when the light from the illumination source is passed through it.

In another aspect of the present invention, a method of exposing a reticle to light is disclosed. A substrate having a photoresist is provided. A polarized reticle of the present invention is disposed between an illumination source and the substrate, wherein the polarized reticle includes at least one first patterned region at least partially surrounded by at least one second patterned region, a top side, and a backside. The top side of the polarized reticle may be exposed using linear polarized light from the illumination source. The linear polarized light may be filtered by the polarized reticle from exiting either the first patterned region or the second patterned region of the backside of the polarized reticle. After one region of the reticle is exposed producing a pattern on the photoresist, the other region of the reticle may subsequently be exposed. Utilizing the polarized reticles of the present invention enables each respective region of the polarized reticle to be exposed under their respective optimal illumination conditions. Thus, a single reticle may be used to expose multiple patterns using optimal illumination conditions for each respective pattern.

In yet another aspect of the invention, a method of exposing a reticle to light is disclosed. A substrate having a photoresist disposed thereon is provided. A polarized reticle of the present invention is disposed between an illumination source and the photoresist on the substrate. The reticle includes a pattern thereon having at least one first patterned region at least partially surrounded by at least one second patterned region. The reticle may be irradiated with linear polarized light from the illumination source. A region of the pattern may be selectively projected onto the photoresist. The polarization direction of the linear polarized light irradiated from the illumination source may then be altered by approximately ninety degrees followed by selectively projecting the other region of the pattern onto the photoresist.

These features, advantages, and alternative aspects of the present invention will be apparent to those skilled in the art from a consideration of the following detailed description taken in combination with the accompanying drawings.

BRIEF DESCRIPTION OF THE SEVERAL VIEWS OF THE DRAWINGS

In the drawings, which illustrate what is currently considered to be the best mode for carrying out the invention.

DETAILED DESCRIPTION OF THE INVENTION

The present invention, in a number of embodiments, includes polarized reticles, methods of manufacturing the polarized reticles, photolithography systems utilizing such polarized reticles, and methods of using the polarized reticles to produce a pattern image that may be used in the processing of substrates. The present invention may be used in photolithographic processing for fabrication of semiconductor devices, liquid crystal display elements, thin-film magnetic heads, reticles, and for many other applications that require accurate photolithographic imaging. The present invention may employ step-and-repeat or step-and-scan type projection printing, or other similar systems.

Figure 1:
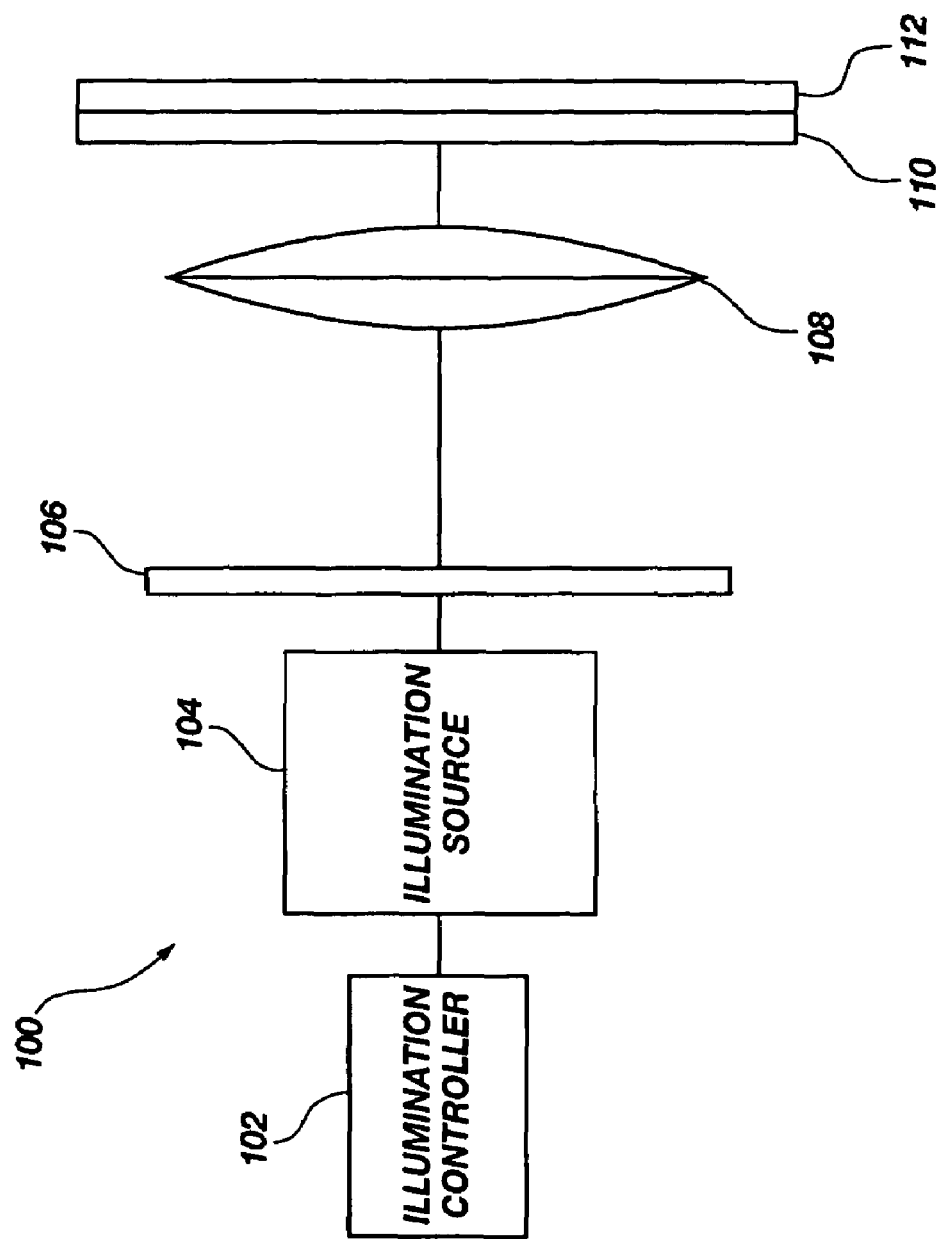
FIG. 1 illustrates a conventional photolithography system.
Figure 2A:
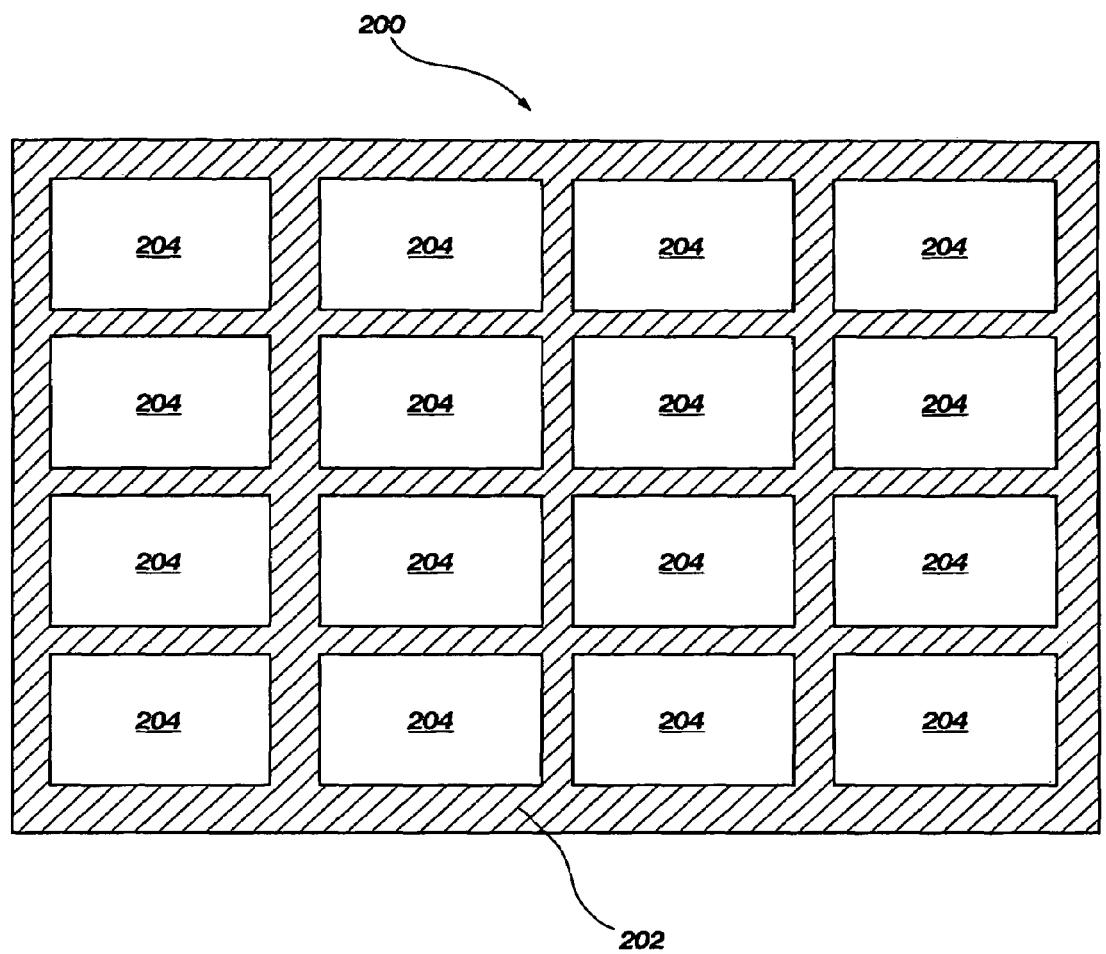
FIG. 2A is a plan view of a typical reticle used in the semiconductor fabrication industry including array and peripheral regions.
Figure 2B:
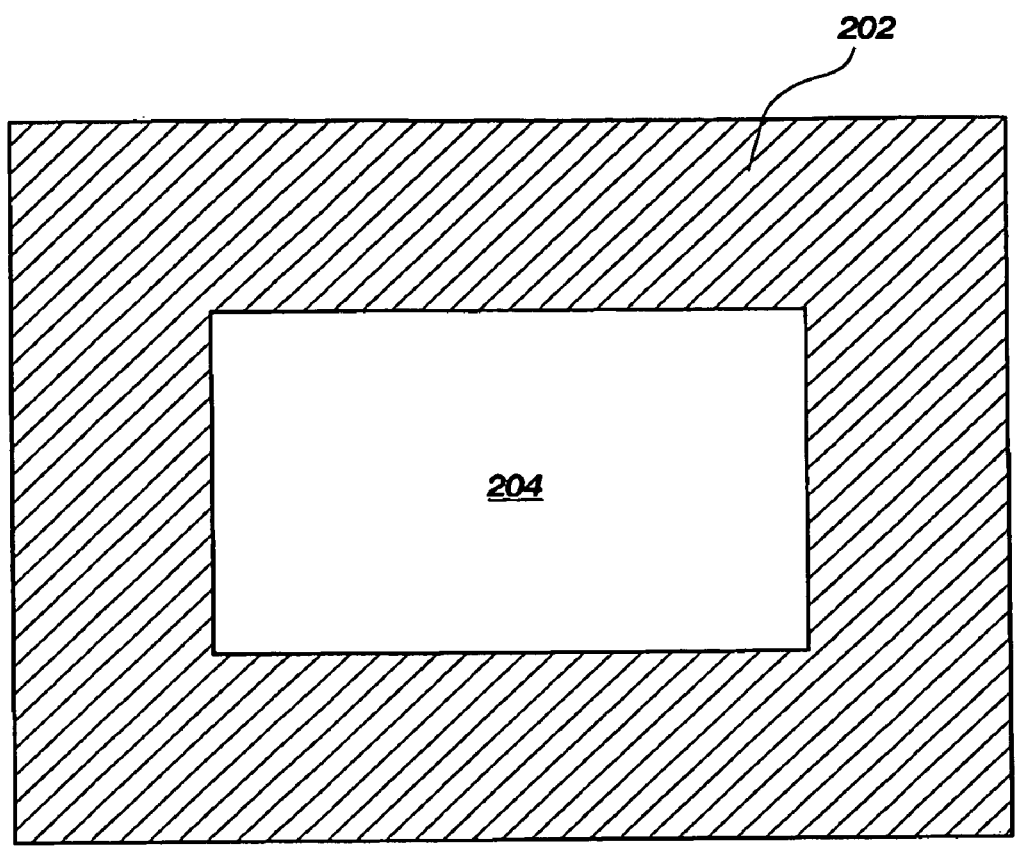
FIG. 2B is an enlarged plan view of a portion of the reticle shown in FIG. 2A.
Figure 3A:
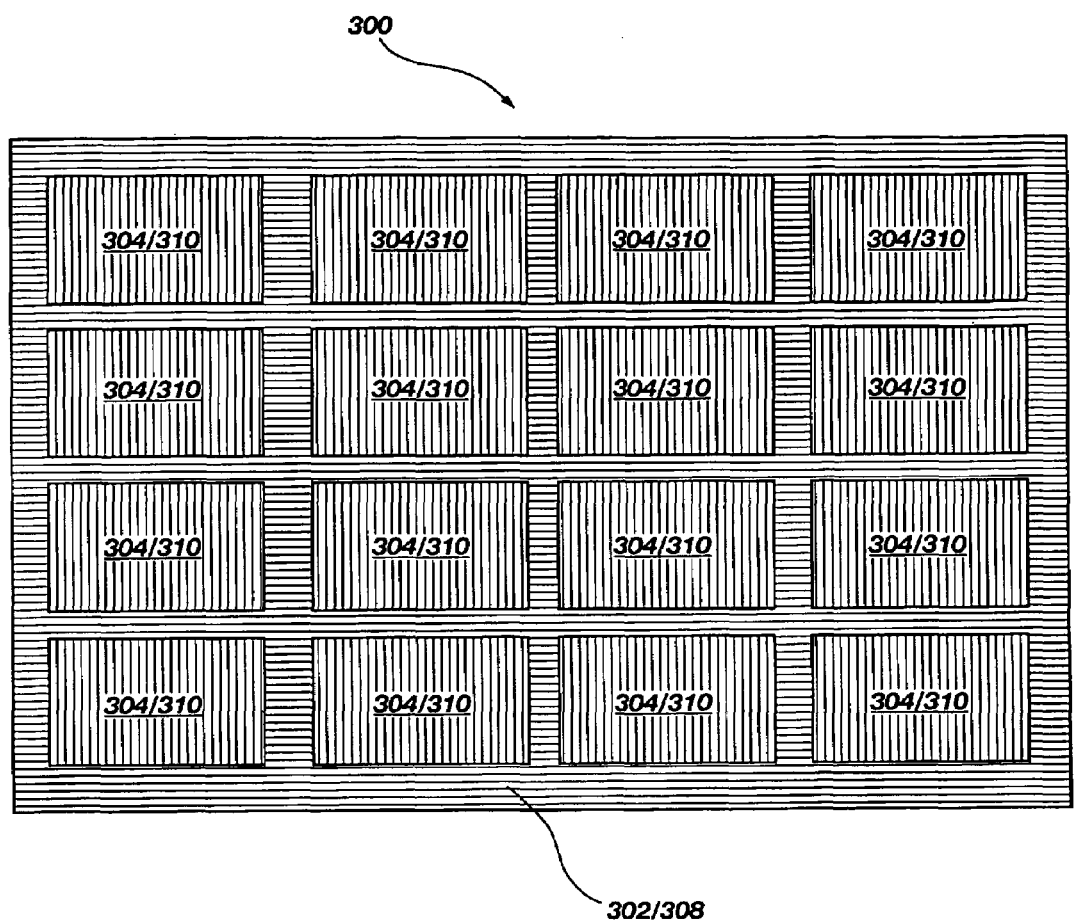
FIG. 3A illustrates a plan view of the top surface of a polarized reticle according to the present invention.
Figure 3B:
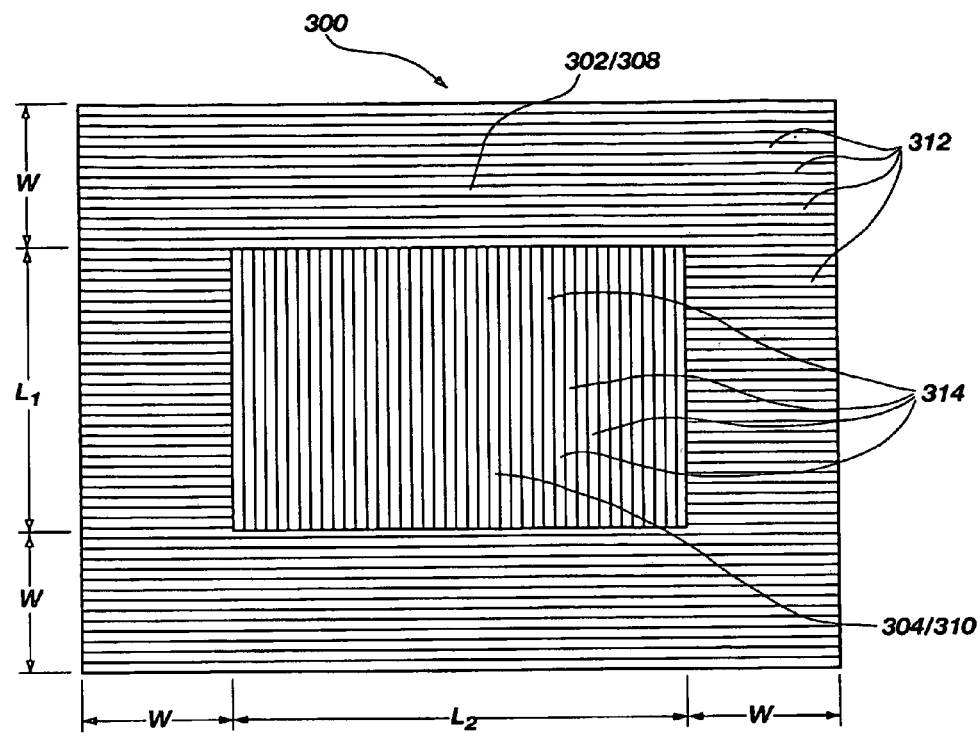
FIG. 3B is an enlarged plan view of a portion of the polarized reticle shown in FIG. 3A.
Figure 3C:
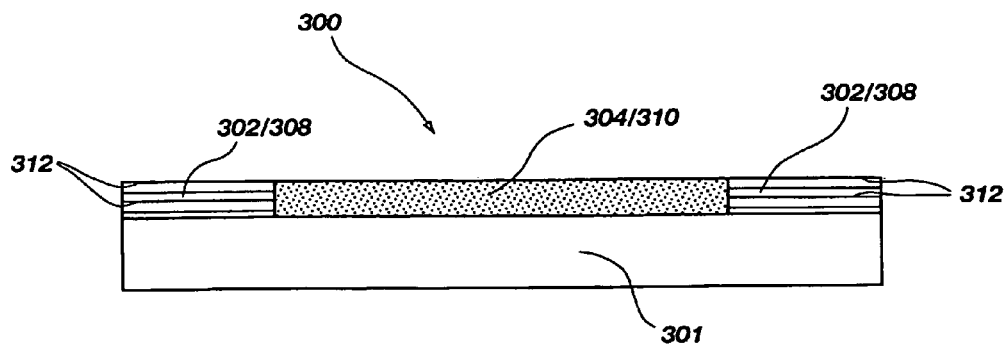
FIG. 3C illustrates a sectional view of a polarized reticle of the present invention.

Referring to FIGS. 3A–3C, an exemplary polarized reticle 300 is shown. Polarized reticle 300 contains a reticle 301 having a pattern defined thereon. Reticle 301 may be formed from materials such as quartz or a borosilicate glass. Fabrication of reticle 301 may be effected using masking and etching techniques common to photolithography processing used in the semiconductor fabrication industry.

As illustrated in FIG. 3A, polarized reticle 300 may be comprised of a plurality of peripheral regions 302 and a plurality of array regions 304. Each array region 304 is generally surrounded by the peripheral region 302. The array region 304 contains a pattern different than a pattern of the peripheral region 302. The pattern contained within the array region 304 may, for example, have larger or smaller feature sizes, be a pattern having a different periodicity, or both, than the pattern contained within the peripheral region 302. The pattern contained within array region 304 may also be a nonperiodic pattern that is different than the pattern contained within the peripheral region 302. The dimensions of the polarized reticle 300 may exhibit dimensions common to reticles used in the semiconductor fabrication industry, such as approximately 6 inches by approximately 6 inches. Referring to FIG. 3B, the width (W) of the peripheral region 302 may be approximately 1/10 of an inch. The array region 304 may have dimensions approximately 1/2 ($L_1$) inches by 1 ($L_2$) inches with the array region 304 generally surrounded by the peripheral region 302. However, the above mentioned dimensions and pattern are merely illustrative and are not meant to limit the present invention. The present invention embraces any polarized reticle comprised of at least one first patterned region at least partially surrounded by at least one second patterned region, wherein the first patterned region includes a pattern different from the pattern of the second patterned region.

Again referring to FIGS. 3B and 3C, a polarized material 308 is disposed over the peripheral region 302 to selectively coat the peripheral region 302 on reticle 301. A polarized material 310 is disposed over the array region 304 to selectively coat the array region 304 on reticle 301. Thus, the polarized material 308 and the polarized material 310 may respectively completely cover the peripheral region 302 and the array region 304. The polarization directions of the polarized material 308 and the polarized material 310 are respectively represented by the lines 312 and 314 on FIGS. 3B and 3C. The polarization direction of the polarized material 310, illustrated with lines 314 in FIG. 3B, is represented by the dots in the array region 304 shown in FIG. 3C. As shown by lines 312 and 314 on FIG. 3B, the respective polarization directions of the polarized material 308 and the polarized material 310 are selected so that they are generally orthogonal to each other. The polarized material 308 and the polarized material 310 may be formed from the same material, but disposed with their respective polarization directions oriented generally orthogonal to each other. If the polarization directions of the polarized material 308 and the polarized material 310 are properly selected, the respective materials may act as filters suitable for filtering out radiation that is linearly polarized in a direction generally orthogonal to the polarization direction of the respective materials. As alluded to above, this filtering phenomenon is attributed to the polarized materials used in the present invention absorbing light that has an electric field vector perpendicular to the polarization direction of such materials and does not absorb light, to an appreciable amount, when the electric field vector of the light is parallel to the polarization direction of such materials.

For instance, linear polarized light having a polarization direction generally parallel to the polarization direction of polarized material 308 will be filtered by polarized material 310. Furthermore, linear polarized light having a polarization direction generally parallel to the polarization direction of the polarized material 310 will be filtered by the polarized material 308. Materials that may be used for the polarized material 308 and polarized material 310 are selected for filtering ultraviolet wavelength light used in photolithography systems. Examples of suitable materials for polarized material 308 and polarized material 310 include inorganic materials such as, for example, calcite, mica, quartz retardation plates, dichroic sheet polarizers, BK7 (borosilicate glass available from Melles Griot), and UV-grade fused silica. Examples of suitable materials for polarized material 308 and polarized material 310 further include organic materials such as, for example, ferroelectric polymers (in bulk form and as a Langmuir-Blodgett film), polyvinylidine fluoride, and liquid crystal polymers. Suppliers of the above materials include Melles Griot and Oriel instruments. These exemplary materials absorb or block approximately 98 percent of incident light having a polarization direction generally orthogonal to the polarization direction of the polarized material.

The films of polarized material 308 and polarized material 310 may be formed on reticle 301 by various deposition techniques. Chemical vapor deposition (CVD), physical vapor deposition (PVD), and atomic layer deposition (ALD) are suitable for depositing the films in the particular defined areas that form the peripheral region 302 and the array region 304 of polarized reticle 300. The application of the polarized materials in the peripheral region 302 and the array region 304 may be performed using masking and etching techniques common to photolithographic processing used in the semiconductor fabrication industry. The polarized material 308 and the polarized material 310 may also be applied to reticle 301 in their respective locations by manual application of preformed films of the above mentioned polarized materials having their respective polarization directions oriented in the desired direction. The manual application of the polarized material 308 and the polarized material 310 may be assisted by an operator/technician performing it under a microscope and using a microcaliper to assist in the accurate placement of the polarized materials on reticle 301 in the desired regions. The films of the polarized material 308 and the polarized material 310 may also be a Langmuir-Blodgett type of film. The Langmuir-Blodgett films are monomolecular layers first preformed on a liquid surface and then transferred onto reticle 301.

Figure 4:
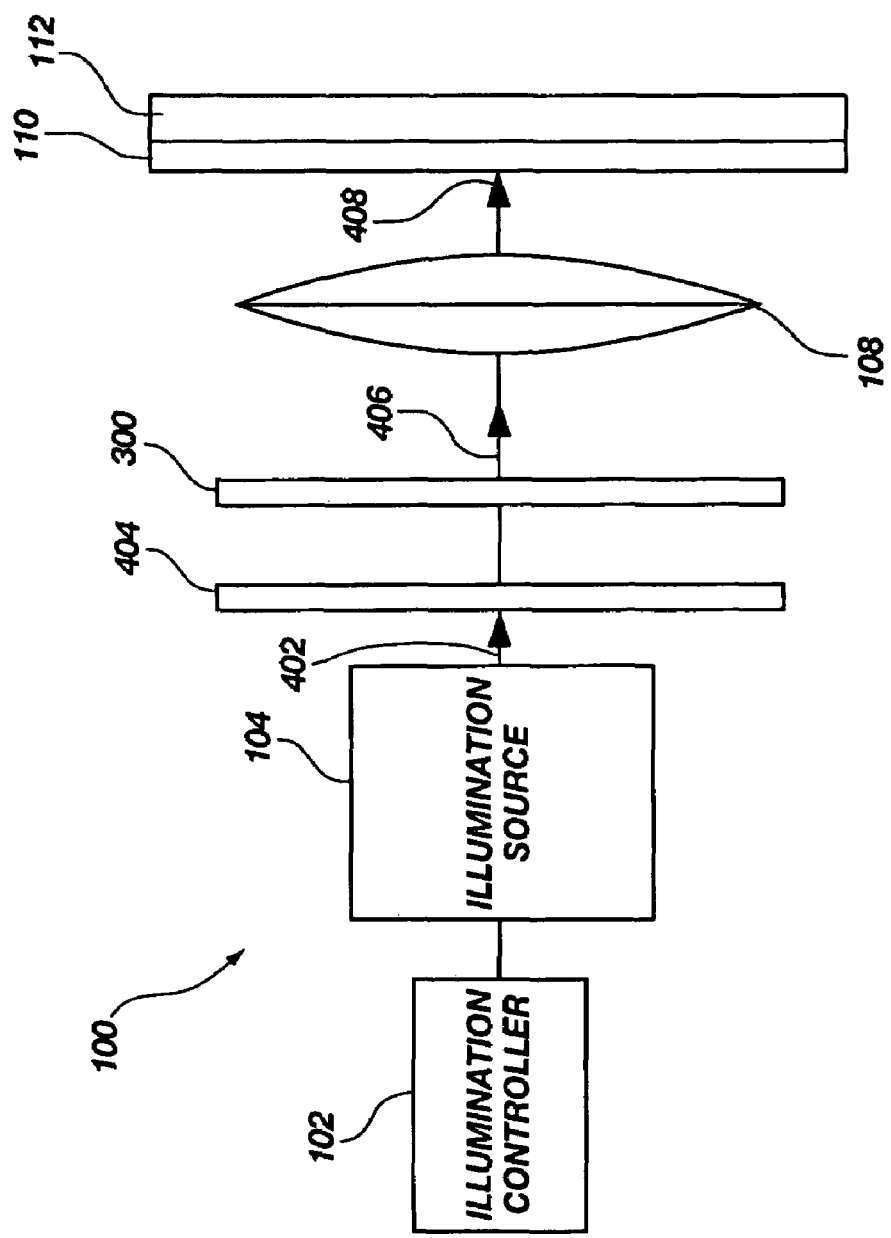
FIG. 4 illustrates an exemplary exposing system used in conjunction with the polarized reticle of the present invention.

Referring to FIG. 4, an exemplary photolithography system 400 using the polarized reticle 300 of the present invention is illustrated. Illumination controller 102 may be controllably coupled to illumination source 104 for projecting linear polarized light 402. Illumination source 104 may be a laser capable of producing linear polarized light. Illumination source 104 may also include, for example, a mirror, a lamp, a laser, a light filter, and/or a condenser lens system. The term "light" as used herein is not restricted to visible light, but may also include any form of radiation energy such as photons, laser beams, or X-rays. Half-wave polarization plate 404 is sized and configured to be inserted in the pathway of linear polarized light 402 using a removable or rotatable chuck (not shown). Half-wave polarization plate 404 may be a half-wave polarization plate formed from mica manufactured by Melles Griot. For example, if the polarization direction of the linear polarized light 402 is polarized in the vertical direction (i.e., perpendicular to the polarized reticle 300 and half-wave polarization plate 404), the half-wave polarization plate 404 oriented with its fast or slow optical axis forty-five degrees to the vertical direction will alter the polarization direction of linear polarized light 402 by ninety degrees upon passing therethrough. Such half-wave polarization plates may be either inserted in the pathway of linear polarized light to change its polarization direction by ninety degrees or the half-wave polarization plate 404 may also be in a fixed positioned in the pathway of linear polarized light 402 and rotated to a specific angle relative to the polarization direction of the linear polarized light 402 to change the polarization direction of linear polarized light 402.

When half-wave polarization plate 404 is configured to be in the pathway of linear polarized light 402, it causes approximately a ninety degree rotation in the polarization direction of linear polarized light 402. Polarized reticle 300, defining a pattern to be projected onto photoresist 110, receives linear polarized light 402 directly from illumination source 104 or from half-wave polarization plate 404 to produce reticle pattern image 406 representative of a selected portion of the pattern of polarized reticle 300. Optionally, polarized reticle 300 may be secured to a hard or soft pellicle to protect polarized reticle 300 from contaminants. Hard pellicles include, for example, glass or polymer fibers.

Again with reference to FIG. 4, a projection lens 108 may receive reticle pattern image 406 from polarized reticle 300. Projection lens 108 may be, for example, a reduction lens or a combination of lenses and/or mirrors for focusing reticle pattern image 406 onto the surface of photoresist 110 on substrate 112. Typical semiconductor fabrication photolithography involves a four to ten times reduction of the pattern size on polarized reticle 300 for projection onto a target substrate 112. Projection lens 108 projects reticle pattern image 406 to produce a projected pattern image 408.

Projected pattern image 408 may then be irradiated onto photoresist 110 on substrate 112. Substrate 112 may be a semiconductor substrate such as single crystal silicon, single crystal gallium arsenide, polysilicon, indium phosphide, a layered bulk semiconductor substrate (such as a silicon on insulator (SOI) substrate as exemplified by a silicon on glass (SOG) or silicon on sapphire (SOS) substrate), a glass (for example, soda-lime glass, borosilicate glass, or quartz) useful for forming reticles, or any other suitable material such as those used in forming liquid crystal displays and thin film magnetic heads. Substrate 112 having photoresist 110 disposed thereon may be supported and held in position on a holding device such as a chuck (not shown) which may be part of, or controlled by, a stepper (not shown), as known in the art.

Again with reference to FIG. 4, the operation of photolithography system 400 used in conjunction with polarized reticle 300 will be more fully understood. Illumination controller 102 initiates illumination source 104 to produce linear polarized light 402. Linear polarized light 402 is selectively polarized in a direction generally parallel to the polarization direction of the polarized material 308 or the polarized material 310. Linear polarized light 402 is also selectively polarized in a direction generally orthogonal to the polarization direction of one of the polarized material 308 or the polarized material 310. Thus, when the polarization direction of linear polarized light 402 is generally parallel to the polarization direction of one of the polarized materials on reticle 301, the light is transmitted through it. Conversely, when the polarization direction of linear polarized light 402 is generally orthogonal to the polarization direction of one of the polarized materials on reticle 301, the light is filtered and does not transmit through to reticle 301. The illumination conditions of the linear polarized light 402 such as the dose, the depth of focus, incidence angle, among other variables may be optimized for the particular region of the polarized reticle 300 being exposed.

For example, linear polarized light 402 having a polarization direction generally orthogonal to the polarization direction of polarized material 308 is irradiated upon polarized reticle 300. Linear polarized light 402 is transmitted through the polarized material 310 and, thus, through array region 304 of polarized reticle 300. The light is not transmitted to a substantial extent through polarized material 308. The reticle pattern image 406 of the array region 304 may then be projected by projection lens 108 to irradiate photoresist 110 with a projected pattern image 408. A pattern representative of the pattern defined within the array region 304 of polarized reticle 300 is formed on photoresist 110.

Following formation of the pattern of array region 304 on photoresist 110, the half-wave polarization plate 404 may be moved in the pathway of the linear polarized light 402 or rotated to the required position if the half-wave polarization plate 404 is already in the pathway of the linear polarized light 402. Upon linear polarized light 402 passing through half-wave polarization plate 404, the polarization direction of the exiting light is altered by approximately ninety degrees. Thus, now the polarization direction of the linear polarized light 402 is generally orthogonal to the polarization direction of polarized material 310 and generally parallel to the polarization direction of the polarized material 308. Then, linear polarized light 402 is transmitted through the polarized material 308 and, thus, through peripheral region 302 of polarized reticle 300. The light is not transmitted to a substantial extent through polarized material 310. The reticle pattern image 406 of the peripheral region 302 may then be projected by projection lens 108 to irradiate photoresist 110 with a projected pattern image 408. A pattern representative of the pattern defined within the peripheral region 302 of polarized reticle 300 is formed on photoresist 110. The above description of the operation of photolithography system 400 is merely an example. Alternatively, the peripheral region 302 may be exposed first, followed by insertion or rotation of the half-wave polarization plate 404, and subsequently the exposing of the array region 304.

Although the foregoing description contains many specifics, these are not to be construed as limiting the scope of the present invention, but merely as providing certain exemplary embodiments. Similarly, other embodiments of the invention may be devised which do not depart from the spirit or scope of the present invention. The scope of the invention is, therefore, indicated and limited only by the appended claims and their legal equivalents, rather than by the foregoing description. All additions, deletions, and modifications to the invention, as disclosed herein, which fall within the meaning and scope of the claims are encompassed by the present invention.

What is claimed is:

1. A polarized reticle comprising:
    a reticle including at least one first patterned region surrounded by at least one second patterned region, the at least one first patterned region and the at least one second patterned region each having different patterns defined thereon;
    a polarized material having a first polarization direction disposed over at least a portion of the at least one first patterned region of the reticle; and
    a polarized material having a second polarization direction generally orthogonal to the first polarization direction disposed over at least a portion of the at least one second patterned region of the reticle.

2. The polarized reticle of claim 1, wherein the reticle includes a plurality of the at least one first patterned region and a plurality of the at least one second patterned region.

3. The polarized reticle of claim 1, wherein the at least one first patterned region is an array region and the at least one second patterned region is a peripheral region.

4. The polarized reticle of claim 3, wherein the polarized material disposed over the at least a portion of the peripheral region is an organic polymer or an inorganic material.

5. The polarized reticle of claim 4, wherein the polarized material is an organic polymer selected from the group consisting of a ferroelectric polymer, polyvinylidine fluoride, and a liquid crystal polymer.

6. The polarized reticle of claim 4, wherein the polarized material is an inorganic material selected from the group consisting of calcite, mica, quartz, and silica.

7. The polarized reticle of claim 3, wherein the polarized material disposed over the at least a portion of the array region is an organic polymer or an inorganic material.

8. The polarized reticle of claim 7, wherein the polarized material is an organic polymer selected from the group consisting of a ferroelectric polymer, polyvinylidine fluoride, and a liquid crystal polymer.

9. The polarized reticle of claim 7, wherein the polarized material is an inorganic material selected from the group consisting of calcite, mica, quartz, and silica.

10. The polarized reticle of claim 3, wherein the reticle comprises at least one of quartz or a glass.

11. The polarized reticle of claim 3, wherein the polarized materials are preformed films.

12. The polarized reticle of claim 11, wherein the preformed films are Langmuir-Blodgett films.

13. The polarized reticle of claim 1, wherein the polarized material disposed over the at least a portion of the at least one first patterned region is an organic polymer or an inorganic material.

14. The polarized reticle of claim 13, wherein the polarized material is an organic polymer selected from the group consisting of a ferroelectric polymer, polyvinylidine fluoride, and a liquid crystal polymer.

15. The polarized reticle of claim 13, wherein the polarized material is an inorganic material selected from the group consisting of calcite, mica, quartz, and silica.

16. The polarized reticle of claim 1, wherein the polarized material disposed over the at least a portion of the at least one second patterned region is an organic polymer or an inorganic material.

17. The polarized reticle of claim 16, wherein the polarized material is an organic polymer selected from the group consisting of a ferroelectric polymer, polyvinylidine fluoride, and a liquid crystal polymer.

18. The polarized reticle of claim 16, wherein the polarized material is an inorganic material selected from the group consisting of calcite, mica, quartz, and silica.

19. The polarized reticle of claim 1, wherein the polarized materials are preformed films.

20. The polarized reticle of claim 19, wherein the preformed films are Langmuir-Blodgett films.

21. The polarized reticle of claim 1, wherein the reticle comprises at least one of quartz or a glass.

22. A photolithography system comprising:
an illumination controller operably coupled to an illumination source configured to irradiate linear polarized light; and
a movable half-wave polarizer disposed between a polarized reticle and the illumination source, the polarized reticle comprising:
a reticle including at least one first patterned region surrounded by at least one second patterned region, the at least one first patterned region and the at least one second patterned region each having different patterns defined thereon;
a polarized material having a first polarization direction disposed over at least a portion of the at least one first patterned region of the reticle; and
a polarized material having a second polarization direction generally orthogonal to the first polarization direction disposed over at least a portion of the at least one second patterned region of the reticle.

23. The photolithography system of claim 22, wherein the movable half-wave polarizer is rotatable.

24. The photolithography system of claim 22, wherein the movable half-wave polarizer is removable.

25. The photolithography system of claim 22, further comprising a projection lens located to receive the linear polarized light passing through the polarized reticle.

26. The photolithography system of claim 22, wherein the polarized materials are each preformed films.

27. The photolithography system of claim 22, wherein the reticle includes a plurality of the at least one first patterned region and a plurality of the at least one second patterned region.

28. The photolithography system of claim 22, wherein the at least one first patterned region is an array region and the at least one second patterned region is a peripheral region.

29. The photolithography system of claim 28, wherein the polarized material disposed over the at least a portion of the peripheral region is an organic polymer or an inorganic material.

30. The photolithography system of claim 29, wherein the polarized material is an organic polymer selected from the group consisting of a ferroelectric polymer, polyvinylidine fluoride, and a liquid crystal polymer.

31. The photolithography system of claim 29, wherein the polarized material is an inorganic material selected from the group consisting of calcite, mica, quartz, and silica.

32. The photolithography system of claim 28, wherein the polarized material disposed over the at least a portion of the array region is an organic polymer or an inorganic material.

33. The photolithography system of claim 32, wherein the polarized material is an organic polymer selected from the group consisting of a ferroelectric polymer, polyvinylidine fluoride, and a liquid crystal polymer.

34. The photolithography system of claim 32, wherein the polarized material is an inorganic material selected from the group consisting of calcite, mica, quartz, and silica.

35. The photolithography system of claim 28, wherein the reticle comprises at least one of quartz or a glass.

36. The photolithography system of claim 28, wherein the polarized materials are each preformed films.

37. The photolithography system of claim 36, wherein the preformed films are Langmuir-Blodgett films.

38. The photolithography system of claim 22, wherein the polarized material disposed over the at least a portion of the first patterned region is an organic polymer or an inorganic material.

39. The photolithography system of claim 38, wherein the polarized material is an organic polymer selected from the group consisting of a ferroelectric polymer, polyvinylidine fluoride, and a liquid crystal polymer.

40. The photolithography system of claim 38, wherein the polarized material is an inorganic material selected from the group consisting of calcite, mica, quartz, and silica.

41. The photolithography system of claim 22, wherein the polarized material disposed over the at least a portion of the second patterned region is an organic polymer or an inorganic material.

42. The photolithography system of claim 41, wherein the polarized material is an organic polymer selected from the group consisting of a ferroelectric polymer, polyvinylidine fluoride, and a liquid crystal polymer.

43. The photolithography system of claim 41, wherein the polarized material is an inorganic material selected from the group consisting of calcite, mica, quartz, and silica.

44. The photolithography system of claim 22, wherein the reticle comprises at least one of quartz or a glass.

45. The photolithography system of claim 38, wherein the polarized materials are each preformed films.

46. The photolithography system of claim 45, wherein the preformed films are Langmuir-Blodgett films.

47. A method of fabricating a polarized reticle comprising:
providing a reticle having at least one first patterned region at least partially surrounded by at least one second patterned region, the at least one first patterned region and the at least one second patterned region each having different patterns defined thereon;
applying a polarized material having a first polarization direction on at least a portion of the at least one first patterned region of the reticle; and
applying a polarized material having a second polarization direction generally orthogonal to the first polarization direction on at least a portion of the at least one second patterned region of the reticle.

48. The method according to claim 47, further comprising preforming the polarized materials prior to application to the reticle.

49. The method according to claim 48, further comprising forming the polarized materials to be Langmuir-Blodgett films.

50. The method according to claim 48, further comprising selecting the polarized materials to be films.

51. The method according to claim 47, wherein the applying the polarized materials comprises depositing the polarized materials on the reticle.

52. The method according to claim 51, wherein the depositing is effected by chemical vapor deposition, physical vapor deposition, or atomic layer deposition.

* * * * *